(12) United States Patent
Moon et al.

(10) Patent No.: US 6,787,831 B2
(45) Date of Patent: Sep. 7, 2004

(54) BARRIER STACK WITH IMPROVED BARRIER PROPERTIES

(75) Inventors: Bum Ki Moon, Tokyo (JP); Gerhard Adolf Beitel, Kamakura (JP); Nicolas Nagel, Yokohama (JP); Andreas Hilliger, Yokohama (JP); Koji Yamakawa, Kawasaki (JP); Keitaro Imai, Yokohama (JP)

(73) Assignees: Infineon Technologies Aktiengesellschaft, Munich (DE); Kabushiki Kaisha Toshiba, Tokyo ( * ) Notice: Subject to any disclaimer, the term of this patent is extended or adjusted under 35 U.S.C. 154(b) by 85 days.

(21) Appl. No.: 10/050,246

(22) Filed: Jan. 15, 2002

(65) Prior Publication Data

US 2003/0132469 A1 Jul. 17, 2003

(51) Int. Cl.⁷ .................. H01L 27/108; H01L 29/76; H01L 29/94; H01L 31/119
(52) U.S. Cl. .................................. 257/295; 257/306
(58) Field of Search ................... 257/295–310; 438/3, 239–254, 396–398

(56) References Cited

U.S. PATENT DOCUMENTS

| | | | |
|---|---|---|---|
| 5,510,651 A | 4/1996 | Maniar et al. | 257/751 |
| 5,838,035 A | 11/1998 | Ramesh | 257/295 |
| 5,892,254 A | 4/1999 | Park et al. | 257/295 |
| 6,090,658 A | 7/2000 | Joo | 438/240 |
| 6,117,689 A | 9/2000 | Summerfelt | 438/3 |
| 6,153,490 A | 11/2000 | Xing et al. | 438/396 |
| 6,288,420 B1 | 9/2001 | Zhang et al. | 257/295 |
| 6,319,765 B1 | 11/2001 | Cho et al. | 438/240 |
| 6,339,007 B1 * | 1/2002 | Wang et al. | 438/396 |

FOREIGN PATENT DOCUMENTS

| | | | | |
|---|---|---|---|---|
| EP | 0 821 415 A2 | 7/1997 | | H01L/27/115 |
| EP | 1 035 588 A2 | 3/2000 | | H01L/29/45 |
| EP | 1 054 441 A2 | 5/2000 | | H01L/21/02 |

* cited by examiner

*Primary Examiner*—Cuong Nguyen
(74) *Attorney, Agent, or Firm*—Horizon IP Pte Ltd (57) ABSTRACT

An barrier stack for inhibiting diffusion of atoms or molecules, such as $O_2$ is disclosed. The barrier slack includes first and second barrier layers formed from, for example, Ir, Ru, Pd, Rh, or alloys thereof. The first barrier layer is passivated with $O_2$ using, for example, a rapid thermal oxidation (RTO) prior to formation of the second barrier layer. The RTO forms a thin oxide layer on the surface of the first barrier layer. The thin oxide layer passivates the grain boundaries of the first barrier layer as well as promoting mismatching of the grain boundaries of the first and second barrier layer.

23 Claims, 8 Drawing Sheets

BARRIER STACK WITH IMPROVED BARRIER PROPERTIES

FIELD OF THE INVENTION

The present invention relates to a barrier stack used in, for example, integrated circuits (ICs) which reduces diffusion of elements, such as oxygen. More particularly, the barrier stack reduces oxidation of the plug in capacitor over plug structures.

BACKGROUND OF THE INVENTION

Figure 1:
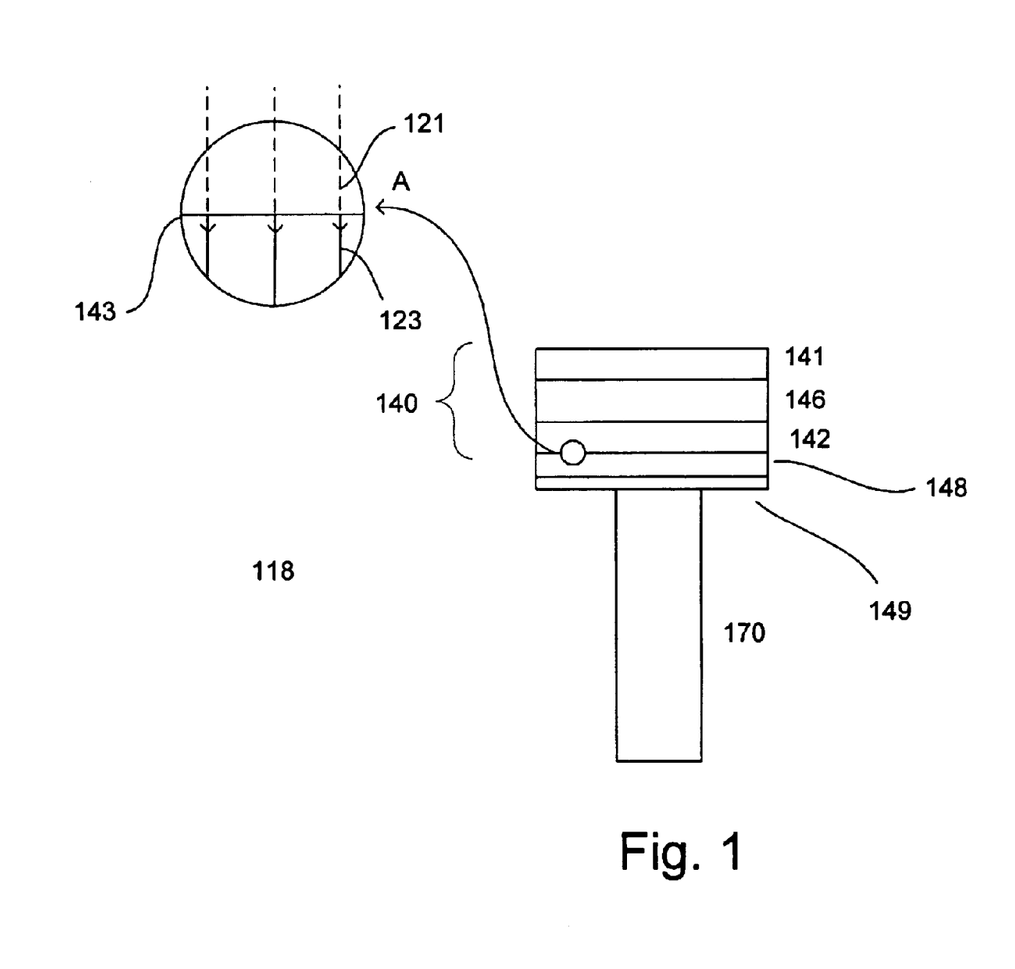
FIG. 1 shows a cross-sectional view of a capacitor on plug structure.

Memory ICs comprise a plurality of memory cells interconnected by bitlines and wordlines. A memory cell includes a transistor coupled to a capacitor for storage of a bit of information. To realize high density memory ICs, the memory cells employ a capacitor over plug structure (COP), as shown in FIG. 1. The structure includes a capacitor 140 having a dielectric layer 146 located between first and second electrodes 141 and 142. The capacitor is coupled to a conductive plug 170.

Typically, a high temperature anneal in an oxygen ($O_2$) ambient is required to improve the properties of the dielectric layer, particularly for high K dielectric and ferroelectric materials. During the anneal, $O_2$ diffuses through the capacitor and oxidizes the plug. This can lead to performance degradation and, in some cases, failures as a result of increased plug resistivity or electrical open connections.

To prevent diffusion of oxygen through the capacitor, a barrier layer formed from iridium is provided between the lower electrode and the plug. An adhesion layer is provided to promote adhesion between the barrier layer and interlevel dielectric layer 118, such as silicon dioxide ($SiO_2$) or silicon nitride (SiN). Iridium is used due to its good barrier properties against $O_2$. In conventional processing, the barrier layer and electrode have vertical grain boundaries 121 and 123 which connect at the interface 143, as shown in caption A. The connection of the vertical grain boundaries of the layers provides diffusion paths for $O_2$. At high temperatures (e.g., >600° C.), $O_2$ can easily diffuse through the grain boundaries of the barrier layer to oxidize the adhesion layer and the plug.

From the foregoing discussion, it is desirable to provide an improved barrier layer for reducing oxidation of the plug in a capacitor over plug structure.

SUMMARY OF THE INVENTION

The invention relates to an improved barrier stack for inhibiting diffusion of atoms or molecules, such as $O_2$. Such barrier stack is particularly useful in, for example, COP structures of memory cells. In one embodiment, the barrier stack is employed in a ferroelectric capacitor. The barrier stack can also be used in other types of capacitors, such as high k dielectric capacitors.

In one embodiment, the barrier stack comprises at least first and second barrier layers in which the grain boundaries of the first and second barrier layers are mismatched. In one embodiment, the barrier layers are conductive. The barrier layers are selected from a group of barrier materials comprising Ir, Ru, Rh, Pd, or alloys thereof. The first and second barrier layers need not be formed from the same material. By providing mismatched grain boundaries, the interface of the layers block the diffusion path of oxygen.

In another embodiment, the grain boundaries of the first barrier layer are passivated with elements. In one embodiment, the grain boundaries are passivated with $O_2$. The $O_2$ stuff the grain boundaries of the barrier layers. Alternatively, elements larger than the grain boundaries of the barrier layer are used to passivate the grain boundaries. Such elements block the grain boundaries of the barrier layer. The grain boundaries, for example, are passivated using a rapid thermal oxidation, which also forms a thin oxide layer on the surface of the first barrier layer. Passivating the grain boundaries of the first barrier layer further enhances the barrier properties of the barrier stack. Alternatively, either all or some of the barrier layers are passivated with elements, such as $O_2$.

The barrier stack, for example, is disposed between the plug and first or lower electrode of a capacitor structure. Optionally, an adhesion layer can be provided beneath the barrier layer.

DETAILED DESCRIPTION OF THE INVENTION

Figure 2:
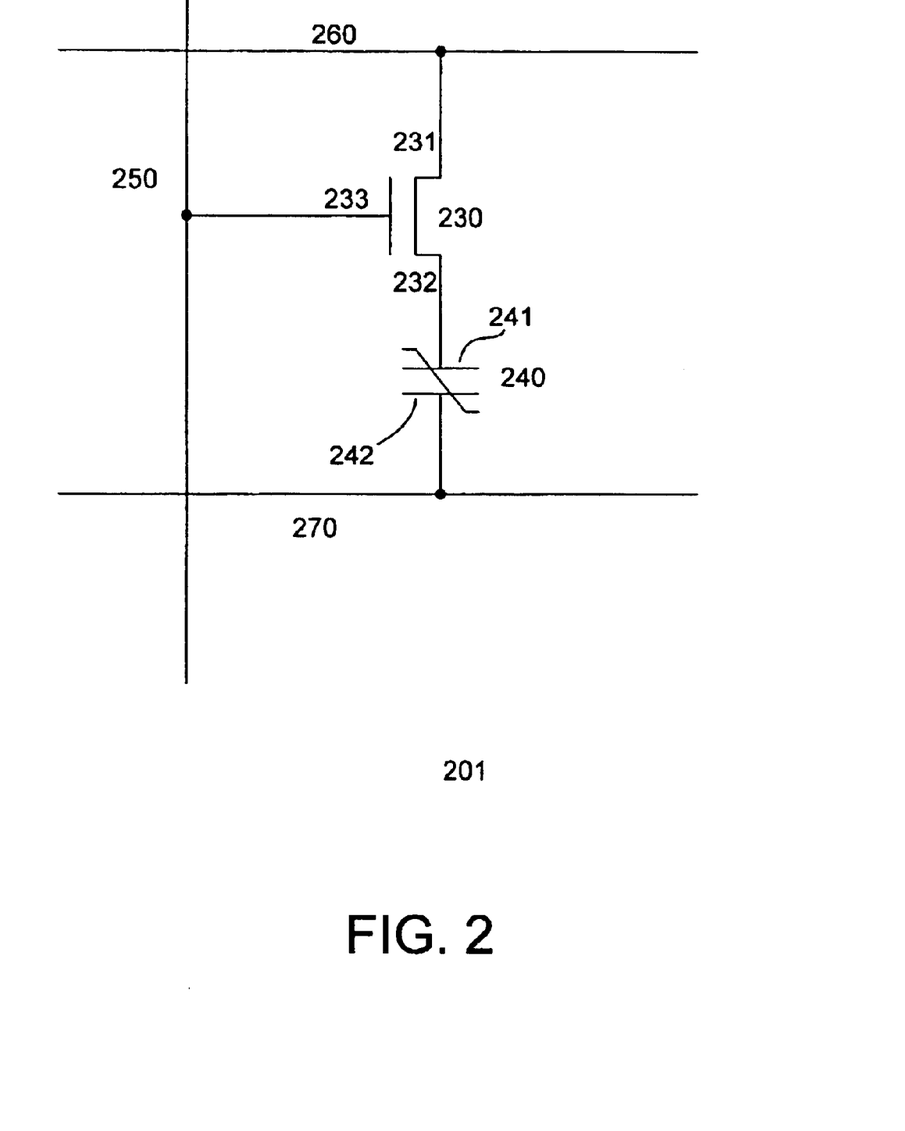
FIG. 2 shows a ferroelectric memory cell.

FIG. 2 shows a ferroelectric memory cell 201 with a transistor 230 and a capacitor 240. A second terminal 232 of the transistor is coupled to a first terminal 241 of the capacitor. Gate 233 and first terminal 231 of the transistor are respectively coupled to a wordline 250 and bitline 260. Coupled to a second terminal 242 of the capacitor is a plateline 270. The capacitor uses the hysteresis polarization characteristic of the ferroelectric material for storing information. The logic value stored in the memory cell depends on the polarization of the capacitor. To change the polarization, a voltage which is greater than the switching voltage (coercive voltage) needs to be applied across the capacitor's electrodes via the bitline and plateline. The polarization of the capacitor depends on the polarity of the voltage applied. An advantage of the ferroelectric capacitor is that it retains its polarization state after power is removed, resulting in a non-volatile memory cell.

Figure 3:
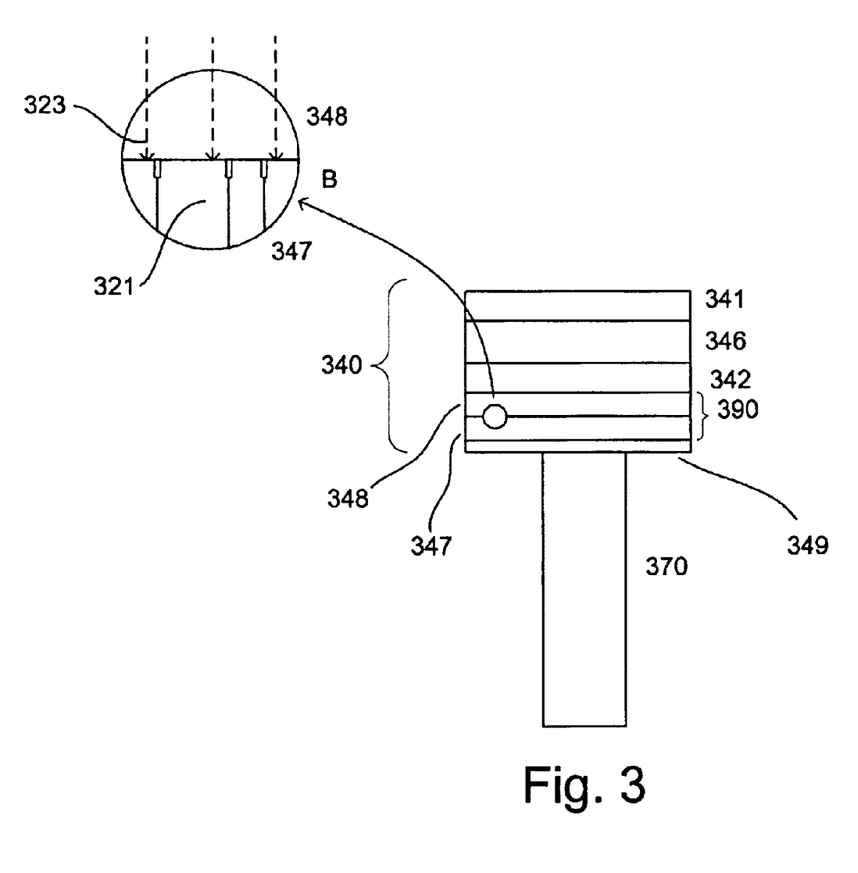
FIG. 3 shows one embodiment of the invention for reducing diffusion of oxygen.

Referring to FIG. 3, a ferroelectric capacitor 340 employing a barrier stack 390 in accordance with one embodiment of the invention is shown. The capacitor includes a ferroelectric layer 346, such as lead zirconium titanate (PZT). Strontium bismuth tantalum (SBT) or other types of ferroelectric materials are also useful. The ferroelectric layer is located between first and second electrodes 341 and 342. The electrodes, for example, comprise a noble metal such as platinum. Other types of conductive materials, for example, $SrRuO_3$, $La_{0.5}Sr_{0.5}O_3$, $LaNiO_3$, or $YBa_2Cu_3O_7$, are also useful. The upper and lower electrodes can be formed from the same or different materials.

A conductive plug is electrically coupled to the lower electrode of the capacitor. The plug is formed from a conductive material such as polysilicon (poly-Si) or tungsten (W). Other conductive materials are also useful. The plug is, for example, coupled to a diffusion region of a transistor of the memory cell. The gate of the transistor is coupled to a wordline and the other diffusion region is coupled to the bitline. The upper electrode is coupled to the plateline.

To prevent oxidation of the plug, a barrier stack 390 is located between the lower electrode and the plug. An adhesion layer 349 is provided between the plug and barrier stack to promote adhesion of the barrier layer to the interlevel dielectric layer 118. The adhesion layer can be formed from, for example, titanium (Ti), tantalum (Ta), titanium nitride/titanium (TiN/Ti), tantalum nitride/tantalum (TaN/Ta), tantalum nitride/titanium (TaN/Ti) or other adhesion promoting materials. In applications where the plug comprises polysilicon, a silicide pre-layer, such as titanium silicide (TiSi), is used to reduce or minimize contact resistance between the plug and adhesion layer. The adhesion layer can also serve to reduce or minimize diffusion of silicon (Si) from the plug into the barrier layer.

In accordance with the invention, the barrier stack comprises at least first and second barrier layers 347 and 348. The barrier layers are, in one embodiment, conductive, creating a conductive barrier stack to electrically couple the lower electrode to the plug. The barrier layers, for example, comprise iridium (Ir). Other types of barrier material, such as ruthenium (Ru), rhodium (Rh), palladium (Pd) or alloys thereof, are also useful. The different barrier layers of the stack can be formed from either the same or different materials. In one embodiment, the grain boundaries 323 and 321 of the barrier layers are mismatched (e.g., not aligned). By mismatching the grain boundaries, the interface between the different barrier layers serve to block the diffusion path of $O_2$, thus improving the barrier properties of the barrier stack. The grain boundaries of the second barrier layer and upper electrode can also be mismatched to further improve barrier properties of the barrier stack.

In one embodiment, the grain boundaries at or near the surface of the first barrier layer are passivated (e.g., stuffed). In one embodiment, the grain boundaries are passivated with $O_2$. Other elements may also be used to passivate the grain boundaries. Various techniques, such as an anneal in an oxidizing ambient, can be used to passivate the grain boundaries. Oxidizing ambient includes, for example, $O_2$, ozone ($O_3$) or $NO_{x (0<x<2)}$. Other techniques for passivating the grain boundaries, which include depositing a thin oxide layer over the barrier layer, are also useful. The thin oxide layer can be deposited by, for example, thermal oxidation. Other deposition techniques can also be used. By passivating the grain boundaries, the diffusion of $O_2$ is further inhibited.

In a preferred embodiment, the grain boundaries are passivated using a rapid thermal oxidation (RTO) process. The RTO also forms a thin oxide layer on the surface of the barrier layer. The thin oxide layer advantageously promotes mismatching of the grain boundaries between the first and second layer. In another preferred embodiment, the grain boundaries at or near the surface of the second barrier layer are also passivated with $O_2$ to further improve the barrier properties of the barrier stack.

Additional barrier layers can be included in the barrier stack. The grain boundaries of adjacent barrier layers are mismatched. In one embodiment, at least the grain boundaries of the bottom barrier layer are passivated at or near its surface. Preferably, the grain boundaries of some or all the barrier layers are passivated at or near their surfaces. Using multiple barrier layers with mismatched boundaries improves the barrier properties of the stack, advantageously enabling the use of thinner barrier stack or layer without sacrificing reliability.

In another embodiment, elements larger than the grain boundaries are used to passivate the grain boundaries at or near the surface of a barrier layer. Such elements block the grain boundaries, eliminating the diffusion path to the plug.

Figure 4:
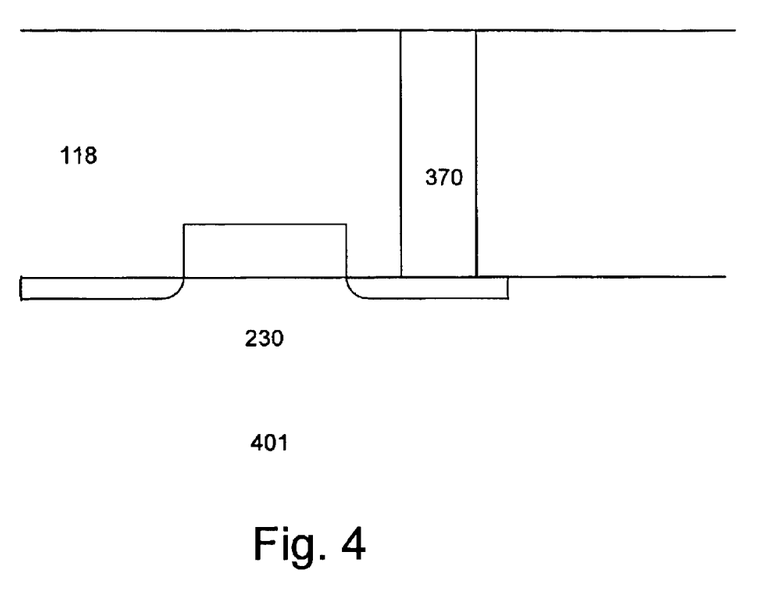
FIGS. 4–6 show a process for fabricating a capacitor over plug in accordance with one embodiment of the invention.
Figure 5:
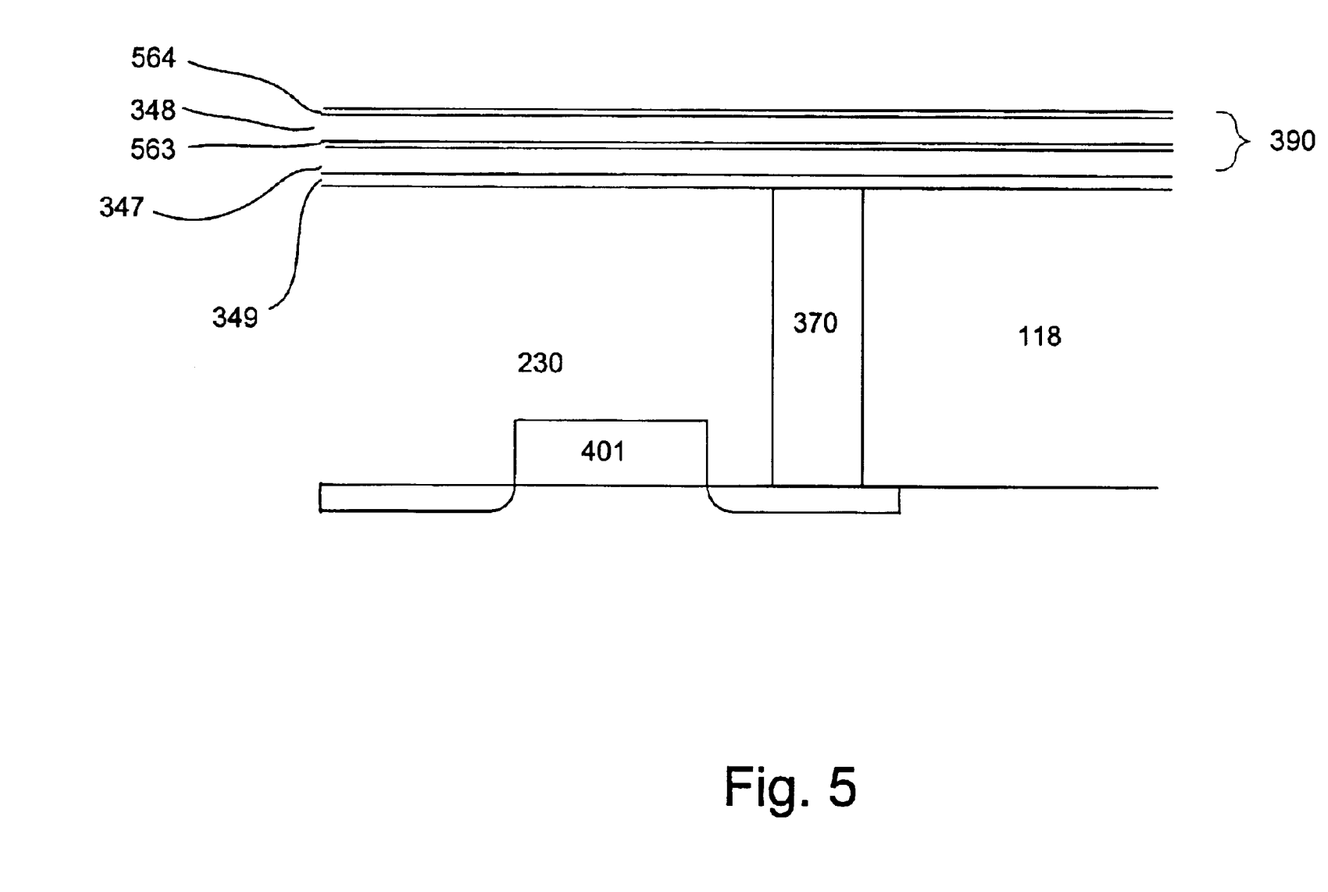
Figure 6:
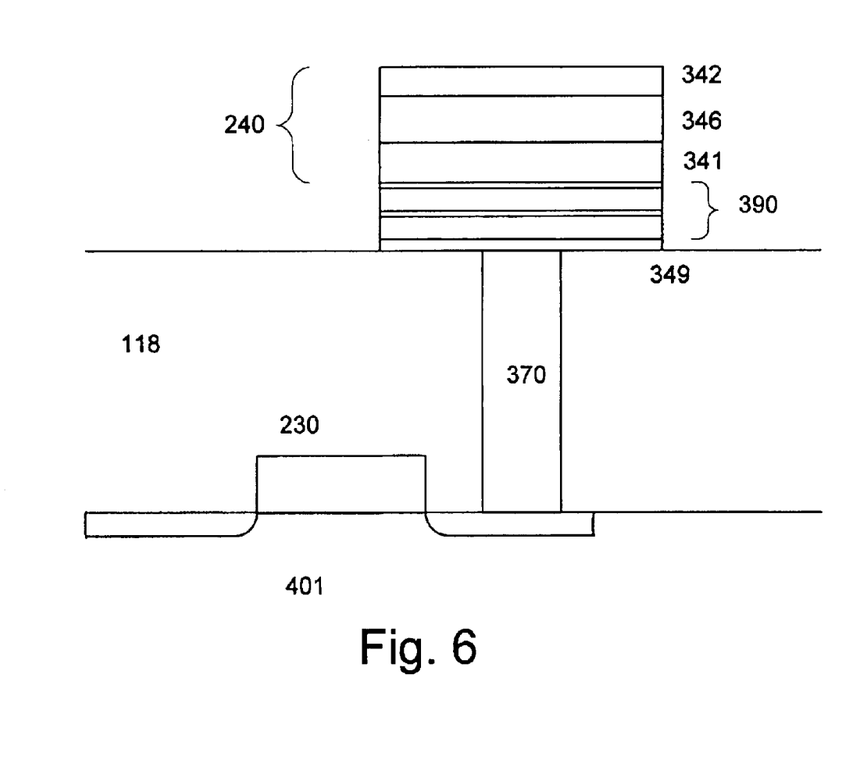

Referring to FIGS. 4–6, a process for fabricating the barrier stack in accordance with one embodiment is shown. The barrier stack is employed, for example, to reduce or prevent oxidation of a plug in a capacitor over plug structure of a memory cell. As shown, a substrate 401 is shown. The substrate comprises a semiconductor substrate such as silicon. Other types of substrate, such as silicon on insulator, can also be used. The substrate is prepared with an ILD 118 formed thereon. The ILD, for example, comprises $SiO_2$. Other types of dielectric materials, such as silicon nitride (SiN), titanium oxide ($TiO_2$), or aluminum oxide ($Al_2O_3$) are also useful. A plug 370, which is coupled to a diffusion region of a transistor 230, is formed in the ILD. The plug, for example, comprises tungsten or poly-Si. Other types of conductive materials are also useful. Various known deposition and patterning techniques can be used to provide the prepared substrate.

Referring to FIG. 5, an adhesion layer 349 is deposited over the dielectric layer. The adhesion layer comprises, for example, titanium (Ti). Other types of adhesion layers, such as tantalum (Ta) or titanium nitride/titanium (TiN/Ti), tantalum nitride/tantalum (TaN/Ta), tantalum nitride/titanium (TaN/Ti), or other adhesion promoting materials can also be used. The adhesion layer is deposited by conventional techniques. Such techniques include, for example, DC sputtering or chemical vapor deposition (CVD). If the plug comprises poly-Si, a pre-layer comprising silicide is formed on the ILD prior to the adhesion layer. The silicide layer can be formed by, for example, annealing of sputtered metal on poly-Si.

The process continues to form the layers of the barrier stack 390. In one embodiment, a first barrier layer 347 of the barrier stack is deposited on the adhesion layer. The first barrier layer comprises, for example, Ir. Other types of barrier layer, such as Ru, Rh, Pd or alloys thereof, are also useful. Various known techniques, including chemical vapor deposition (CVD), chemical solution deposition (CSD), electroplating, hydro-thermal synthesis or physical vapor deposition (PVD) can be used to form the barrier layer.

In accordance with one embodiment of the invention, the first barrier layer is annealed in an $O_2$ ambient. During the anneal, $O_2$ from the ambient fills the grain boundaries of the barrier layer near its surface. In one embodiment, the anneal also oxidizes the barrier layer, forming a thin oxide layer 563 on the surface thereof. The oxide comprises oxide of the material used to form the barrier layer. For example, an $IrO_x$ is formed if an Ir barrier layer is used. Additionally, the anneal relieves the stress between the adhesion layer and barrier layer. Preferably, the anneal comprises an RTO. The RTO, for example, is performed at a temperature of 400–700° C. for about 5–600 sec.

A second barrier layer 348 is deposited over the first barrier layer. The second barrier layer comprises, for example, Ir. Other types of barrier layers are also useful. It is not necessary that the different barrier layers of the barrier stack are formed from the same material.

Due to the fact that the second barrier layer is formed over thin oxide layer and not the first barrier layer, the crystallization and grain growth behavior of the barrier layers are different. Specifically, the columnar grain growth of the second barrier layer is not grown along the first layer's grain boundary, leading to a misfit grain growth between the barrier layers.

In an alternative embodiment, mismatch in grain growth can be facilitated by depositing a thin conductive layer over the first barrier layer which is different from the first barrier layer. The conductive layer, for example, comprises a conductive oxide. Alternatively, using different first and second barrier layers are also useful. In yet another embodiment, different process parameters can be used to deposit the first and second barrier layers to promote different grain growth (e.g., different grain sizes).

In another embodiment, after the second barrier is formed, an anneal in an oxidizing ambient is performed. Preferably, the anneal comprises an RTO in an oxidizing ambient. The anneal forms an oxide layer over the second barrier layer as well as stuffing the grain boundaries near the surface of the second barrier layer.

Referring to FIG. 6, the process continues to form the capacitor on the barrier stack over the plug. In one embodiment, the process continues to form a ferroelectric capacitor. Forming other types of capacitors are also useful. The process includes sequentially forming first conductive electrode layer 341, ferroelectric layer 346, and second electrode layer 342. The electrode, for example, comprises a noble metal. Other types of conductive materials can also be used. In one embodiment, the ferroelectric material comprises PZT. Other types of ferroelectric materials, such as SBT, are also useful. Various known techniques are can be used to form the different layers of the capacitor. Such techniques, for example, include CVD, chemical solution deposition (CSD), electroplating, hydro-thermal synthesis, or physical vapor deposition (PVD).

The various layers on the ILD are patterned to form the capacitor over plug structure. The layers are patterned using, for example, conventional mask and etch techniques. Other patterning techniques can also be used. After forming the capacitor, the substrate is annealed in an oxygen ambient to recover the electrical characteristics of the capacitor. The anneal for example, is performed at a temperature of about 500–800° C. for about 1 minute to 5 hours. During the anneal, oxygen diffuses through the layer of the capacitor as well as the grain boundaries of the second barrier layer. However, the diffusion path at the interface of the barrier layers are blocked due to the mismatch in grain boundaries of the barrier layers and stuffing of the grain boundaries of the first barrier layer near its surface with oxygen. Since diffusion of oxygen through the bulk of the barrier layer is much slower than that along the grain boundaries, oxygen diffusing through the barrier stack is reduced. This reduces oxidation of the plug, thus improving reliability.

EXPERIMENTS

Figure 7:
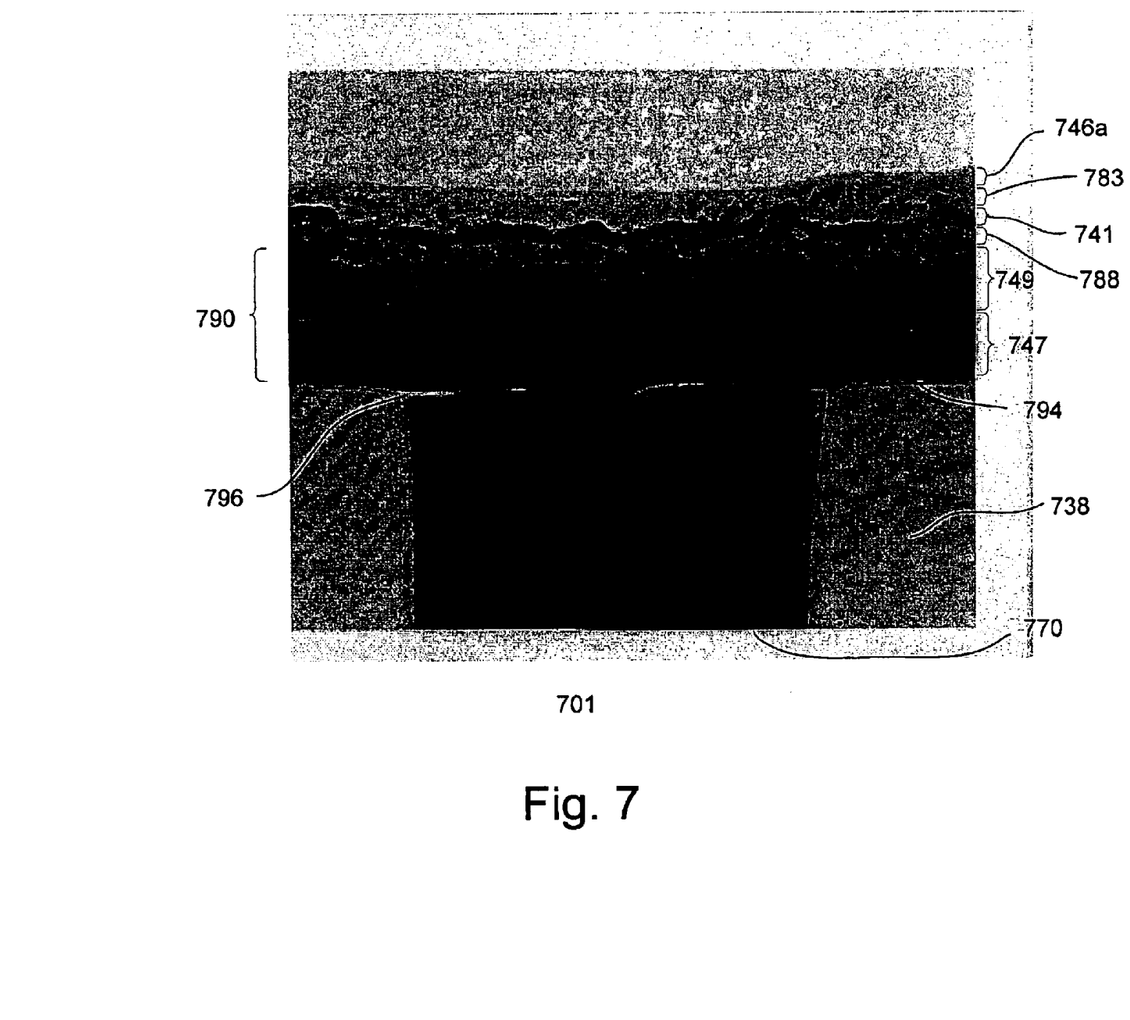
FIGS. 7–8 are TEMs of experiments conducted on a barrier stack formed in accordance with one embodiment of the invention.

FIG. 7 shows TEM of a COP test structure 701 which includes a barrier stack 390 formed in accordance with one embodiment of the invention. The test structure includes a tungsten plug 770 formed in a $SiO_2$ ILD layer 738. A 10 nm thick titanium layer 794 is sputtered deposited over the plug. The titanium layer serves as an adhesion layer, promoting adhesion between the ILD and the subsequently formed barrier layer. The barrier includes first and second 70 nm thick iridium layers 747 and 749, each deposited by sputtering in 50 sccm of argon gas for about 45 seconds. An RTO in $O_2$ is performed after the formation of the first and second iridium layers, each at 600° C. for about 30 seconds to passivate the grain boundaries of the first iridium layer.

A 10 nm platinum electrode 741, a 10 nm strontium ruthineum oxide (SRO) 783, first 746a and second 70 nm PZT, 10 nm SRO, and 10 nm platinum electrode layers are sequentially sputtered over the barrier layer. An RTO was performed after the deposition of each SRO and PZT layer. The RTO after formation of an SRO layer was performed in $O_2$ at 650° C. for 30 seconds to crystallize the SRO layer while the RTO after deposition of a PZT layer was performed in $O_2$ at 650° C. for 30 seconds. Due to the various RTOs, an iridium oxide layer 788 is formed between the barrier layer and electrode 741. The layers above the first PZT layers were removed by the preparation process to acquire the TEM. As shown in FIG. 7, the interface between the plug and barrier layer has not been oxidized, evidenced by the relatively clean interface line 796 between the barrier and plug.

Figure 8:
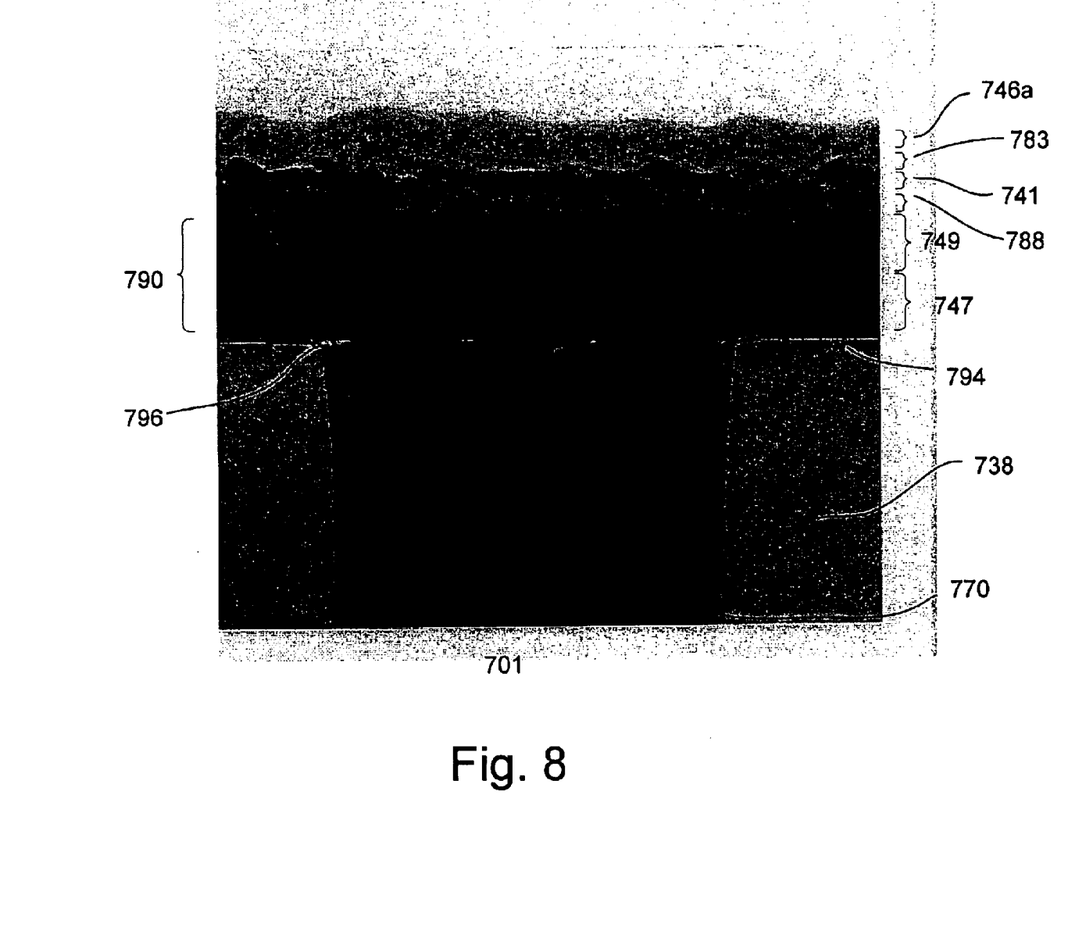

FIG. 8 shows a TEM of the structure of FIG. 7 after annealing in $O_2$ at 650° C. for 2 hours. The post anneal serves to improve the properties of the ferroelectric layer. As shown in FIG. 8, the interface 796 between the plug and barrier layer remains relatively unchanged after the anneal. This indicates that the barrier layer adequately prevented the diffusion of $O_2$ to the plug during the post anneal, thus avoiding oxidizing the plug.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A barrier stack comprising:
    a first barrier layer having a top surface;
    a thin intermediate layer on the top surface of the first barrier layer formed by a thermal process in an oxidizing ambient, the thin intermediate layer providing elements to stuff the grain boundaries on or near the top surface of the first barrier layer; and
    a second barrier layer on the thin intermediate layer, wherein the grain boundaries of the first and second barrier layer are mismatched, the stuffed grain boundaries of the first barrier layer and mismatched grain boundaries of the first and second barrier layers enhance, the barrier properties of the barrier stack.

2. The barrier stack of claim 1 wherein the barrier layer serves as a barrier layer for a capacitor over plug structure having:
    a capacitor having a capacitor dielectric layer disposed between first and second electrodes, and
    a plug electrically coupled to the first electrode wherein the barrier stack is disposed between the plug and the first electrode to reduce oxidation of the plug.

3. The barrier stack of claim 2 wherein the capacitor over plug structure further comprises an adhesion layer between the barrier stack and the plug.

4. The barrier stack of claim 2 wherein the capacitor of the capacitor over plug structure comprises a ferroelectric capacitor having a ferroelectric layer disposed between the first and second electrodes.

5. The barrier stack of claim 4 further comprises an adhesion layer between the barrier stack and plug.

6. The barrier stack of claim 1, 2, 3, 4, or 5 wherein the oxidizing ambient comprise, oxygen, ozone or $NO_{x(0<x<2)}$ to form the intermediate layer comprising an oxide, the oxidizing ambient providing elements comprising oxygen.

7. The barrier stack of claim 6 further comprises a second thin intermediate layer on a top surface of the second barrier layer formed by thermal process in oxidizing ambient, the second thin intermediate layer providing elements to stuff the grain boundaries on or near the top surface of the second barrier layer.

8. The barrier stack of claim 7 wherein the thermal process comprises rapid thermal oxidation.

9. The barrier stack of claim 6 wherein the thermal process comprises rapid thermal oxidation.

10. The barrier stack of claim 6 wherein the barrier layers comprise a material selected from the group of materials comprising Ir, Rh, Ru, Pd, or alloys thereof, wherein the first and second barriers are formed from same or different materials.

11. The barrier stack of claim 9 wherein the barrier layers comprise a material selected from the group of materials comprising Ir, Rh, Ru, Pd, or alloys thereof, wherein the first and second barriers are formed from same or different materials.

12. The barrier stack of claim 7 wherein the barrier layers comprise a material selected from the group of materials comprising Ir, Rb, Ru, Pd, or alloys thereof, wherein the first and second barriers are formed from same or different materials.

13. The barrier stack of claim 8 wherein the barrier layers comprise a material selected from the group of materials comprising Ir, Rh, Ru, Pd, or alloys thereof, wherein the first and second barriers are formed from same or different materials.

14. A capacitor over plug structure comprising:
  a capacitor having first and second electrodes separated by a capacitor dielectric layer;
  a plug coupling the first electrode of the capacitor; and
  a barrier stack disposed between the plug and the first electrode comprising:
    a first barrier layer having a top surface;
    an intermediate layer on the top surface of the first barrier layer formed by a thermal process in an oxidizing ambient, the thin intermediate layer providing elements to stuff the grain boundaries on or near the top surface of the first barrier layer; and
    a second barrier layer on the thin intermediate layer, wherein the grain boundaries of the first and second barrier layer are mismatched, the stuffed grain boundaries of the first barrier layer and mismatched grain boundaries of the first and second barrier layers enhance the barrier properties of the barrier stack to reduce oxidation of the plug.

15. The capacitor over plug structure of claim 14 wherein the capacitor comprises a ferroelectric capacitor.

16. The capacitor over plug structure of claim 14 or 15 wherein the oxidizing ambient comprises oxygen, ozone or $NO_{x(0<x<2)}$, the thermal process forms the intermediate layer comprising an oxide and the oxidizing ambient provides elements comprising oxygen to stuff the grain boundaries.

17. The capacitor over plug structure of claim 16 wherein the thermal process comprises rapid thermal oxidation.

18. The capacitor over plug structure of claim 17 wherein the barrier layers comprise a material selected from the group of materials comprising Ir, Rh, Ru, Pd, or alloys thereof, the barrier layers can be formed from same or different materials.

19. The capacitor over plug structure of claim 16 further comprises a second intermediate layer on a top surface of the second barrier layer formed by thermal process in oxidizing ambient, the second intermediate layer providing elements to stuff the grain boundaries at or near the top surface of the second barrier layer.

20. The capacitor over plug structure of claim 19 wherein the barrier layers comprise a material selected from the group of materials comprising Ir, Rh, Ru, Pd, or alloys thereof, the barrier layers can be formed from same or different materials.

21. The capacitor over plug structure of claim 20 wherein the thermal process comprises rapid thermal oxidation.

22. The capacitor over plug structure of claim 14 or 15 wherein the barrier layers comprise a material selected from the group of materials comprising Ir, Rh, Ru, Pd, or alloys thereof, the barrier layers can be formed from same or different materials.

23. The capacitor over plug structure of claim 16 wherein the barrier layers comprise a material selected from the group of materials comprising Ir, Rh, Ru, Pd, or alloys thereof, the barrier layers can be formed from same or different materials.

* * * * *